(12) United States Patent
Warntjes

(10) Patent No.: US 10,073,156 B2
(45) Date of Patent: *Sep. 11, 2018

(54) METHODS AND SYSTEMS FOR IMPROVED MAGNETIC RESONANCE ACQUISITION

(71) Applicant: SyntheticMR AB, Linköping (SE)

(72) Inventor: Marcel Warntjes, Ljungsbro (SE)

(73) Assignee: SyntheticMR AB, Linköping (SE)

( * ) Notice: Subject to any disclaimer, the term of this patent is extended or adjusted under 35 U.S.C. 154(b) by 661 days.

This patent is subject to a terminal disclaimer.

(21) Appl. No.: 14/412,070

(22) PCT Filed: Jun. 28, 2013

(86) PCT No.: PCT/SE2013/000105
§ 371 (c)(1),
(2) Date: Dec. 30, 2014

(87) PCT Pub. No.: WO2014/007715
PCT Pub. Date: Jan. 9, 2014

(65) Prior Publication Data
US 2015/0177350 A1    Jun. 25, 2015

Related U.S. Application Data

(63) Continuation-in-part of application No. 13/540,027, filed on Jul. 2, 2012, now Pat. No. 9,618,596.

(51) Int. Cl.
*G01V 3/00* (2006.01)
*G01R 33/50* (2006.01)
(Continued)

(52) U.S. Cl.
CPC .......... *G01R 33/50* (2013.01); *G01R 33/5602* (2013.01); *G01R 33/5613* (2013.01); *G01R 33/5616* (2013.01); *G01R 33/56341* (2013.01)

(58) Field of Classification Search
CPC .................... G01R 33/5613; G01R 33/56341
(Continued)

(56) References Cited

U.S. PATENT DOCUMENTS

| 4,634,979 A | 1/1987 | Riederer et al. |
| 4,641,095 A | 2/1987 | Riederer |

(Continued)

FOREIGN PATENT DOCUMENTS

| JP | 62-64345 | 3/1987 |
| JP | 4-288141 | 10/1992 |

(Continued)

OTHER PUBLICATIONS

Stewart C. Bushong, ScD, Magentic Resonance Imaging, 1996, Mosby-Year Book, Inc., Second Edition, pp. 86.*

(Continued)

*Primary Examiner* — Louis Arana
(74) *Attorney, Agent, or Firm* — Oblon, McClelland, Maier & Neustadt, L.L.P.

(57) ABSTRACT

A magnetic resonance imaging apparatus and method simultaneously measure physical properties including relaxation rates, proton densities, and apparent diffusion coefficients of a subject. The apparatus and method use a single magnetic resonance acquisition of the subject in order to measure the physical properties.

20 Claims, 4 Drawing Sheets

(51) Int. Cl.
  *G01R 33/561* (2006.01)
  *G01R 33/563* (2006.01)
  *G01R 33/56* (2006.01)

(58) Field of Classification Search
  USPC .............................................. 324/307, 309
  See application file for complete search history.

(56) References Cited

U.S. PATENT DOCUMENTS

| | | | |
|---|---|---|---|
| 4,720,678 A * | 1/1988 | Glover | G01R 33/56509 |
| | | | 324/309 |
| 4,881,033 A | 11/1989 | Denison et al. | |
| 5,262,945 A | 11/1993 | DeCarli et al. | |
| 5,270,654 A * | 12/1993 | Feinberg | G01R 33/5615 |
| | | | 324/307 |
| 5,486,763 A | 1/1996 | Alfano | |
| 5,786,692 A * | 7/1998 | Maier | G01R 33/56341 |
| | | | 324/307 |
| 6,366,797 B1 | 4/2002 | Fisher et al. | |
| 6,823,205 B1 | 11/2004 | Jara | |
| 6,917,199 B2 | 7/2005 | Jara | |
| 7,002,345 B2 | 2/2006 | Jara | |
| 7,973,530 B2 | 7/2011 | Warntjes | |
| 8,148,982 B2 * | 4/2012 | Witschey | G01R 33/5605 |
| | | | 324/307 |
| 8,289,329 B2 | 10/2012 | Warntjes | |
| 8,643,363 B2 | 2/2014 | Warntjes | |
| 8,873,822 B2 | 10/2014 | Warntjes | |
| 8,874,189 B2 | 10/2014 | Warntjes | |
| 2007/0167727 A1 | 7/2007 | Menezes et al. | |
| 2010/0127704 A1 | 5/2010 | Warntjes | |
| 2011/0018537 A1 | 1/2011 | Warntjes | |
| 2014/0002076 A1 | 1/2014 | Warntjes | |
| 2014/0180061 A1 | 6/2014 | Warntjes | |

FOREIGN PATENT DOCUMENTS

| | | |
|---|---|---|
| JP | 4-309330 | 10/1992 |
| JP | 2001-515736 | 9/2001 |
| WO | 2008/132686 A1 | 11/2008 |
| WO | 2011/114264 A1 | 9/2011 |
| WO | 2012/050487 A1 | 4/2012 |

OTHER PUBLICATIONS

Stewart C. Bushong, ScD, Magentic Resonance Imaging, 1996, Mosby-Year Book, Inc., Second Edition, pp. 89-90.*
EPO, Supplementary European Search Report in EP 13 81 3853, dated Nov. 18, 2016.
Stehning et al., Volumetric Simultaneous T1, T2, T2* and Proton Density Mapping in One Minute Using Interleaved Inversion Recovery SSFP and Multi Gradient Echo Imaging, Proc. Int'l Soc. Magnetic Resonance in Medicine, Apr. 16, 2008, p. 241, vol. 16, Toronto, CA.
Markl et al., Gradient Echo Imaging, J. Magnetic Resonance Imaging, Jun. 15, 2012, pp. 1274-1289, vol. 35, No. 6, Wiley Periodicals, Inc.
R. Maitra et al., Bayesian Reconstruction in Synthetic Magnetic Resonance Imaging, Proc. SPIE, 1998, pp. 39-47, vol. 3459.
M. Prastawa et al., Synthetic Ground Truth for Validation of Brain Tumor MRI Segmentation, Med Image Comput Comput Assist Interv., 2005, pp. 26-33, 8 (Pt 1).
K.H. Cheng et al., In-vivo Tissue Characterization of Brain by Synthetic MR Proton Relaxation and Statistical Chisquares Parameter Maps, Proc. 8th Symposium on Computer-Based Medical Systems, 1995, pp. 338-345, IEEE.
M. Warntjes et al., Rapid Magnetic Resonance Quantification on the Brain: Optimization for Clinical Usage, Magnetic Resonance in Medicine, 2008, pp. 320-329, vol. 60, Wiley-Liss, Inc.
B. Grassiot et al., Quantification and Clinical Relevance of Brain Atrophy in Multiple Sclerosis: A Review, J. Neurol., 2009, pp. 1397-1412, vol. 256, Springer.
J. West et al., Novel Whole Brain Segmentation and Volume Estimation Using Quantitative MRI, Eur. Radial., Nov. 24, 2011, pp. 1-10, Springer.
Sweden Patent and Reg. Office, Int'l Search Report in PCT/SE2013/000105, dated May 12, 2013.
Sweden Patent and Reg. Office, Written Opinion in PCT/SE2013/000105, dated May 12, 2013.
Office Action dated Dec. 20, 2016 in Japanese Patent Application No. 2015-520112, with English-language Translation, 8 pages.
Office Action dated Dec. 5, 2017 in Japanese Patent Application No. 2015-520112, with English-language Translation, 4 pages.

* cited by examiner

METHODS AND SYSTEMS FOR IMPROVED MAGNETIC RESONANCE ACQUISITION

TECHNICAL FIELD

The present invention relates to a method, system and computer program product for improved magnetic resonance acquisition. In particular the present invention relates to a method, system and computer program product for the simultaneous measurement of the physical properties $R_1$ and $R_2$ relaxation rate, proton density and the apparent diffusion coefficient using a single magnetic resonance acquisition.

BACKGROUND

Magnetic Resonance Imaging (MRI) can generate cross-sectional images in any plane (including oblique planes). Medical MRI most frequently relies on the relaxation properties of excited hydrogen nuclei (protons) in water and fat. When the object to be imaged is placed in a powerful, uniform magnetic field the spins of the atomic nuclei with non-integer spin numbers within the tissue all align either parallel to the magnetic field or anti-parallel. The output result of an MRI scan is an MRI contrast image or a series of MRI contrast images.

In order to understand MRI contrast, it is important to have some understanding of the time constants involved in relaxation processes that establish equilibrium following RF excitation. As the excited protons relax and realign, they emit energy at rates which are recorded to provide information about their environment. The realignment of proton spins with the magnetic field is termed longitudinal relaxation and the rate (typically about 1 $s^{-1}$) required for a certain percentage of the tissue nuclei to realign is termed "$R_1$ relaxation rate" or $R_1$. T2-weighted imaging relies upon local dephasing of spins following the application of the transverse energy pulse; the transverse relaxation rate (typically >10 $s^{-1}$ for tissue) is termed "$R_2$ relaxation rate" or $R_2$. These relaxation rates are also expressed as relaxation times $T_1$ (=$1/R_1$) and $T_2$ (=$1/R_2$). The total signal depends on the number of protons, or proton density PD. The total signal is decreased due to random motion of the protons, a process which can be enhanced by the application of a large bipolar gradient; moving protons acquire a phase difference which leads to a further signal loss. The signal loss indicates the diffusion of water molecules and can be measured as the apparent diffusion coefficient ADC. The measurement of the direction in which diffusion occurs is named fractional anisotropy FA. On the scanner console all available parameters, such as echo time TE, repetition time TR, flip angle α and the application of preparation pulses and gradients (and many more), are set to certain values. Each specific set of parameters generates a particular signal intensity in the resulting images depending on the characteristics of the measured tissue.

Generally MR images are qualitative in nature: the absolute image signal intensity has no meaning, it is the signal intensity differences, the contrast, which is interpreted. This leads to subjective reading of images, inherent inaccuracy and user dependence. MR quantification, on the other hand, aims at measurement of physical properties on an absolute scale. This provides a firm basis for objective measures and automated tissue recognition. Examples are measurement of brain volume for dementia follow-up, tumour volume for oncology and lesion load for Multiple Sclerosis.

There is a constant demand for improvements in MR imaging. It would therefore be desirable to provide improved and faster methods for obtaining measurements of physical properties such as $R_1$, $R_2$, PD and ADC.

SUMMARY

It is an object of the present invention to provide a method and device to address at least parts of the problems outlined above.

This object and potentially others are obtained by the methods and devices as set out in the appended claims.

In accordance with embodiments described herein a method to estimate the $R_1$ and $R_2$ relaxation times, the proton density PD using a single magnetic resonance acquisition is provided. In accordance with some embodiments the apparent diffusion coefficient ADC can also be estimated using the single magnetic resonance acquisition is provided. In accordance with some embodiments, depending how the set-up is R1-R2-PD or R1-R2-PD-ADC can be simultaneously estimated.

In MRI there are three main physical properties that have an effect on signal intensity in the MR images: The longitudinal $R_1$ relaxation rate (the inverse of the $T_1$ relaxation time), the transverse $R_2$ relaxation rate (the inverse of the $T_2$ relaxation time) and the proton density PD. These three properties can be measured on with quantitative MRI. In contrast to conventional MR imaging, which results in qualitative images with a relative image intensity scale, a quantitative MRI scan results in the measurement of physical properties such as $R_1$, $R_2$ and PD on an absolute scale. These values are independent of scanner settings and hence directly reflect the underlying tissue. Thus, each tissue type has its own characteristic combination of $R_1$, $R_2$ and PD. For example the mean values for white matter in the brain are approximately ($R_1$, $R_2$, PD)=(1.7 $s^{-1}$, 14 $s^{-1}$, 64%), for grey matter (1.0 $s^{-1}$, 12 $s^{-1}$, 85%) and for cerebrospinal fluid (0.24 $s^{-1}$, 1.5 $s^{-1}$, 100%) (see e.g. Warntjes et al. Rapid Magnetic Resonance Quantification on the Brain: Optimization for Clinical UsageMagn Reson Med 2008; 60:320-329). Typical values for the ADC are 0.9, 0.8 and 4.0 $10^{-3}$ mm/s, respectively. Including noise of the measurement and partial volume effects, an area in the multi-parametric $R_1$-$R_2$-PD-ADC space can be specified to contain brain tissue and CSF. These values differ from for example muscle or fat.

In accordance with some embodiments the MR properties correspond to at least one of $R_1$ and $R_2$ relaxation rate or proton density, or relaxation time, where $T_1$=$1/R_1$ and $T_2$=$1/R_2$.

In accordance with embodiments described herein a magnetic resonance imaging method of simultaneously estimating multiple physical parameters using a single gradient echo acquisition type is provided. The method comprises obtaining at least three parallel, segmented gradient-echo acquisitions. The acquisitions are interleaved with a $R_1$-sensitizing phase, a $R_2$ sensitizing phase and a delay time, and measures for $R_1$ and $R_2$ relaxation rate and proton density PD are generated from the at least three acquisitions.

In accordance with some embodiments the at least three acquisitions are preformed twice, resulting in at least six acquisitions, wherein the acquisitions are interleaved with at least two $R_1$-sensitizing phases, a $R_2$ sensitizing phase, a diffusion sensitizing phase and delay time(s), and where measures for $R_1$ and $R_2$ relaxation rate, proton density PD and apparent diffusion coefficient ADC are generated from the at least six acquisitions.

The acquisition can be a spoiled gradient acquisition also called turbo field echo, TFE. In an alternative embodiment the acquisition can be a balanced steady state free precession acquisition (bSSFP) also called balanced turbo field echo, (bTFE). In yet another embodiment the acquisition is an echo planar imaging acquisition (EPI). The acquisition type can also be a combination of a TFE and an EPI acquisition.

Further, the acquisition can be performed on a two-dimensional, 2D slice. In another embodiment the acquisition is performed on a three-dimensional, 3D, volume.

In accordance with some embodiments the $R_1$ sensitizing phase consists of a 90 degrees RF saturation pulse. In accordance with another embodiment the R1 sensitizing phase consists of a 180 degrees RF inversion pulse. In accordance with some embodiments the $R_2$ sensitizing phase consists of a 90 degrees RF pulse, a 180 degrees refocusing pulse and a -90 degrees RF pulse. In accordance with some embodiments the $R_2$ sensitizing phase consists of a 90 degrees RF pulse, multiple 180 degrees refocusing pulses and a -90 degrees RF pulse.

In accordance with some embodiments the diffusion sensitizing phase consists of a 90 degrees RF pulse, a 180 degrees refocusing pulse and a -90 degrees RF pulse where the 180 degrees refocusing pulse is straddled by gradients.

In accordance with some embodiments the $R_1$ relaxation rate is estimated using the image signal intensity of all acquisitions after the $R_1$ sensitizing phase.

In accordance with some embodiments the $R_2$ relaxation rate is estimated using the image signal intensity of the acquisitions prior to and after the $R_2$ sensitizing phase.

In accordance with some embodiments the $B_1$ field of a scanner used for the acquisitions is estimated using the image signal intensity of the acquisitions prior to and after the $R_1$ sensitizing phase.

In accordance with some embodiments the ADC is estimated using the image signal intensity of the acquisitions prior to and after the $R_2$ sensitizing phase and prior to and after the diffusion sensitizing phase.

The invention also extends to a computerized imaging system arranged to perform the methods as described herein and also to a digital storage medium having stored thereon computer program instructions/software segments that when executed by a computer causes a computer to execute the methods as described herein.

Among the advantages of the methods described herein is that the physical properties of a patient can be measured on an absolute scale with a single sequence in a very short time.

BRIEF DESCRIPTION OF THE DRAWINGS

The present invention will now be described in more detail by way of non-limiting examples and with reference to the accompanying drawings, in which.

DETAILED DESCRIPTION

In the following description, for purposes of explanation and not limitation, specific details are set forth such as particular architectures, interfaces, techniques, etc. However, it will be apparent to those skilled in the art that the described technology may be practiced in other embodiments that depart from these specific details. That is, those skilled in the art will be able to devise various arrangements which, although not explicitly described or shown herein, embody the principles of the described technology. In some instances, detailed descriptions of well-known devices, circuits, and methods are omitted so as not to obscure the description of the present invention with unnecessary detail. All statements herein reciting principles, aspects, and embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that block diagrams herein represent conceptual views of illustrative circuitry embodying the principles of the technology.

Similarly, it will be appreciated various processes described may be substantially represented in a computer-readable medium and can be executed by a computer or processor.

The functions of the various elements including functional may be provided through the use of dedicated hardware as well as hardware capable of executing software. When a computer processor is used, the functions may be provided by a single dedicated processor, by a single shared processor, or by a plurality of individual processors, some of which may be shared or distributed. Moreover, a controller as described herein may include, without limitation, digital signal processor (DSP) hardware, ASIC hardware, read only memory (ROM), random access memory (RAM), and/or other storage media.

Figure 1:
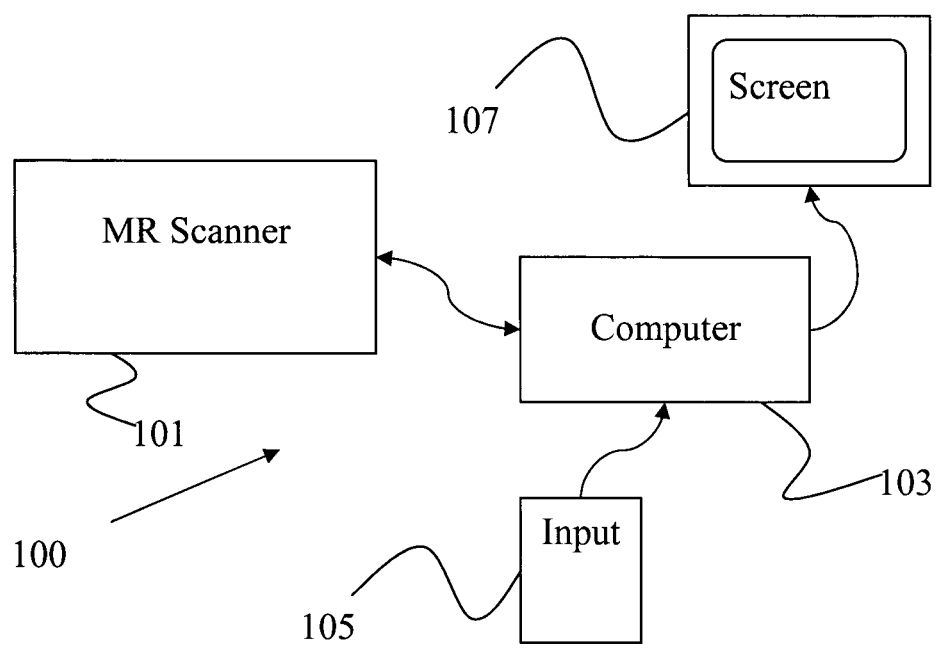
FIG. 1 is a schematic outline of an MR system.

In FIG. 1 a general view of a setup of a MRI system 100 is depicted. The system 100 comprises a MR scanner 101. The MR scanner is operative to generate MRI data by means of scanning a living object. The MR scanner is further connected to a computer 103 for processing data generated by the scanner 101. The computer comprises a central processor unit coupled to a memory and a number of input and output ports for receiving and outputting data and information. The computer 103 receives input commands from one or several input devices generally represented by an input device 105. The input device may be one or many of a computer mouse, a keyboard, a track ball or any other input device. The computer 103 is further connected to a screen 107 for visualizing the processed scanner data as a contrast image. In particular the computer 103 can comprise controller unit(s)/imaging circuitry arranged to perform methods as described herein.

In MRI there are three main physical properties that have an effect on signal intensity in the MR images: The longitudinal $R_1$ relaxation rate (the inverse of the $T_1$ relaxation time), the transverse $R_2$ relaxation rate (the inverse of the $T_2$ relaxation time) and the proton density PD. A fourth physical property, diffusion, can be obtained by application of a large bipolar gradient. Any moving spin will acquire a phase difference due to the gradient, which leads to loss of signal. Hence a high diffusion is associated with a high signal loss. These four properties can be measured on an absolute scale with quantitative MRI. Each tissue has its own characteristic combination of $R_1$, $R_2$ and PD. For example the mean values for white matter in the brain are approximately ($R_1$, $R_2$, PD)=(1.7 s$^{-1}$, 14 s$^{-1}$, 64%), for grey matter (1.0 s$^{-1}$, 12 s$^{-1}$, 85%) and for cerebrospinal fluid (0.24 s$^{-1}$, 1.5 s$^{-1}$, 100%) (see e.g. Warntjes et al. Rapid Magnetic Resonance Quantification on the Brain: Optimization for Clinical Usage-Magn Reson Med 2008; 60:320-329). Typical values for the ADC are 0.9, 0.8 and 4.0 10$^{-3}$ mm/s, respectively. Including noise of the measurement and partial volume effects, an area in the multi-parametric $R_1$-$R_2$-PD-ADC space can be specified to contain brain tissue and CSF. These values differ from for example muscle or fat.

Signal intensity of the MR quantification sequence is probed using a segmented gradient echo sequence, where multiple images are acquired in parallel. The acquisition can be any gradient echo type, such as a spoiled gradient acquisition (also called turbo field echo, TFE), a balanced steady state free precession acquisition (bSSFP, also called balanced turbo field echo, bTFE), an echo planar imaging acquisition (EPI) or a combination of a TFE and an EPI acquisition. For a segmented acquisition only a part of the acquisition is performed per repetition time TR. A full acquisition is obtained by repeating the TR until the acquisition is complete. Images can then be acquired in parallel by consecutive measurement of small segments of the separate images.

In accordance with some embodiments multiple imaging volumes are acquired in parallel while interleaved with specific sensitizing phases and time delays in order to simultaneously measure multiple physical parameters.

In accordance with one embodiment, for the measurement of $R_1$, a $R_1$-sensitizing phase is required, followed by 2 or more acquisitions. A $R_1$-sensitizing phase can for example consist of a 90 degrees RF saturation pulse to set the longitudinal Mz magnetization to zero. In an alternative implementation the R1-sensitizing phase can consist of a 180 degrees RF inversion pulse to invert the longitudinal Mz magnetization. For a measurement of $R_2$ a $R_2$-sensitizing phase is required, straddled by two acquisitions. A $R_2$-sensitizing phase can for example consist of a 90 degrees RF pulse, one or more 180 degrees RF refocusing pulses and a −90 degrees RF pulse to sensitize the longitudinal Mz magnetization with $R_2$ relaxation. For the ADC a diffusion-sensitizing phase is required, straddled by two acquisitions. A diffusion sensitizing phases is similar to a $R_2$ sensitizing phase, where the 180 degrees refocusing pulses are straddled by gradients. In particular, the refocusing pulses can be straddled by large gradients, such that the area under the gradients (zeroth order) causes a (significant) phase evolution of the spins.

Figure 2:
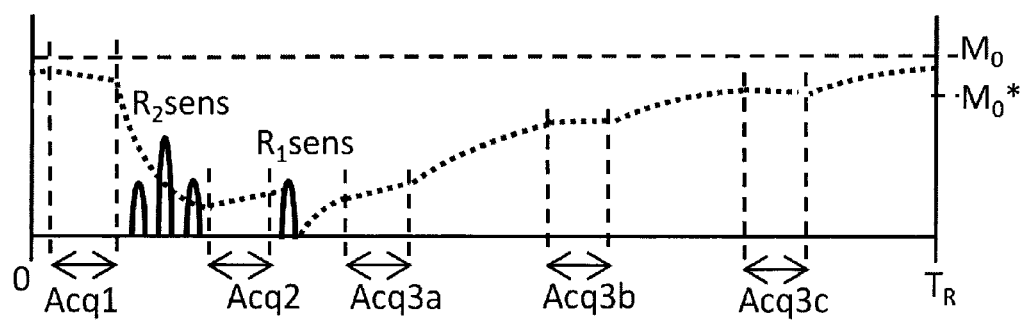
FIG. 2 is a schematic outline of the MR sequence with a $R_1$ sensitizing phase, a $R_2$ sensitizing phase and a single acquisition where 5 imaging volumes are acquired in parallel.

An exemplary method for performing a combined measurement of $R_1$, $R_2$ and PD is exemplified in FIG. 2. Five acquisitions are performed in parallel by dividing them into segments where each segment runs through the exemplified kernel of FIG. 4a. The kernel is repeated for each segment until the acquisitions are completed. A kernel in accordance with the exemplary embodiment of FIG. 2 consists of a first acquisition Acq1, after which a $R_2$-sensitizing phase $P_{R2}$ is applied, followed by a second acquisition Acq2 and a $R_1$-sensitizing phase $P_{R1}$. Finally the third acquisition with delay time is performed. The latter acquisition can be repeated, in the example three times (Acq3a, Acq3b and Acq3c).

Assuming that the acquisitions have no effect on the magnetization the $R_1$ and PD can be found using the signal intensities after the $R_1$-sensitizing phase $P_{R1}$, in the example the 4 acquisitions Acq3a, Acq3b, Acq3c and Acq1, where the magnetization $M_i$ of each acquisition i increases with the delay time $t_i$ after $P_{R1}$ as:

$$R_1 = \frac{-t_i}{\ln((M_0 - M_i)/M_0)}$$

The proton density PD is proportional to $M_0$. Since there are two variables at least 2 acquisitions i at 2 different delay times $t_i$ must be acquired post-$P_{R1}$ (i.e. at least Acq3a and Acq1).

The MR scanner may have an inhomogeneous $B_1$ field, which can be measured using the ratio between the signal intensity post and prior to the $R_1$-sensitizing phase $P_{R1}$, in the example Acq3 and Acq2:

$$B_1 = a \cos(M_{post-PR1}/M_{pre-PR1})$$

$R_2$ can be found using the ratio between the signal intensity prior to and after the $R_2$-sensitizing phase $P_{R2}$, in the example Acq1 and Acq2:

$$R_2 = \frac{\ln(M_{pre-PR2}/M_{post-PR2})}{\Delta T_E}$$

In FIGS. 3a and 3b two examples of $R_2$-sensitizing phases are displayed, with a 90 degrees RF pulse, one or more 180 degrees refocusing pulses and a −90 degrees RF pulse. The time $\Delta TE$ corresponds to the time difference between the two 90 degrees RF pulses. The minimum number of acquisitions for a combined $R_1$, $R_2$ and PD measurement is 3 (Acq1, Acq2 and Acq3a).

Figure 3:
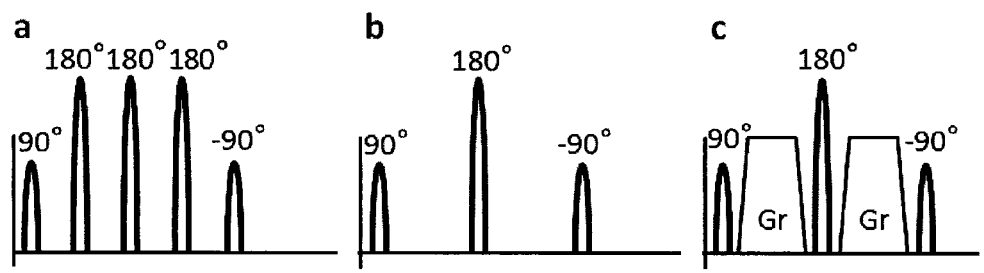
FIG. 3 is a schematic outline of two different $R_2$ sensitizing phases (a and b) and a diffusion sensitizing phase (c).
Figure 4A:
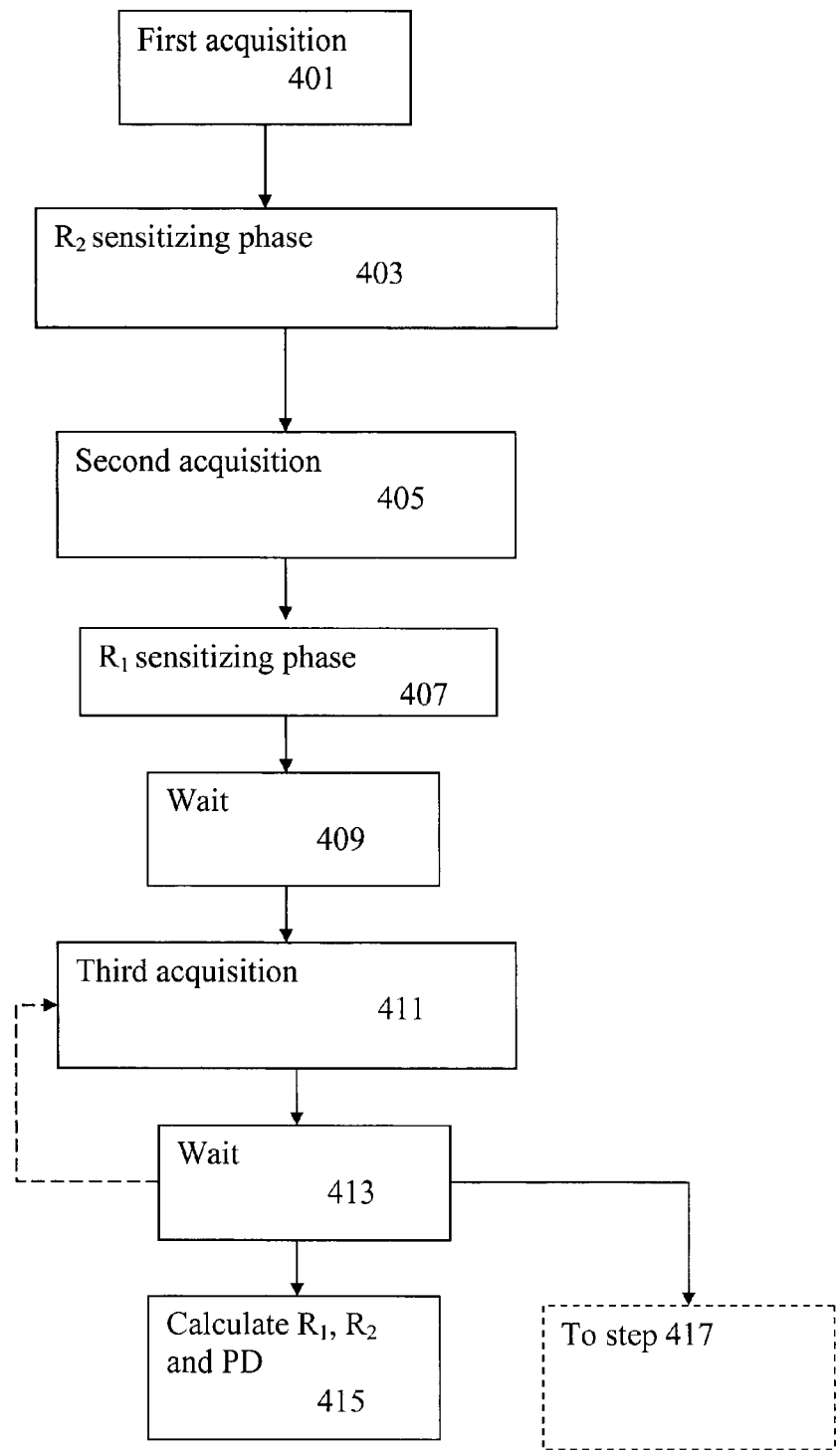
FIGS. 4a and 4b are flowcharts illustrating some steps performed when estimating physical properties such as $R_1$, $R_2$, PD and ADC.

For a combined measurement of $R_1$, $R_2$, PD and ADC a longer kernel is required, as exemplified in FIGS. 4a plus 4b. Here, the example of FIG. 2 must be repeated twice, where at one instance the $R_2$-sensitizing phase $P_{R2}$ is used, as sketched in FIG. 3b, and at one instance the $P_{R2}$ is replaced with a diffusion sensitizing phase $P_{diff}$ as sketched in FIG. 3c. The decay rate ADC due to diffusion can be calculated as:

$$ADC = \frac{\ln(M_{pre-Pdiff}/M_{post-Pdiff})}{\Delta T_E} - \frac{\ln(M_{pre-PR2}/M_{post-PR2})}{\Delta T_E}$$

The minimum number of acquisitions for a combined $R_1$, $R_2$, PD and ADC measurement is 6 (Acq1, Acq2, Acq3a, Acq4, Acq5 and Acq6a). If all three directions in space must be probed for diffusion, the example in FIG. 2 must be repeated 4 times. In that case one $P_{R2}$ is applied and three $P_{diff}$ with the diffusion gradients are applied in the three different directions x, y and z and hence the minimum number of acquisition is 12.

If the acquisition does have an effect on magnetization, the magnetization evolution during a TR can be calculated numerically where each magnetization $M_{n+1}$ can be derived from a prior magnetization $M_n$ at a time step $\Delta t$. In the absence of RF pulses this is:

$$M_{n+1} = M_0 - (M_0 - M_n)\exp(-R_1 \Delta t)$$

In the presence of RF acquisition pulses with flip angle α this is:

$$M_{n+1} = M^*_0 - (M^*_0 - M_n)\exp(-R^*_1 \Delta t)$$

where $R_1^*$ is the effective observed $R_1$ and the $M_0^*$ is the effective observed $M_0$:

$$\frac{R_1}{R_1^*} = \frac{M_0^*}{M_0} = \frac{1-\exp(-R_1 T_R)}{1-\cos(\alpha)\exp(-R_1 T_R)}$$

All of the steps described in conjunction with FIGS. 2 and 3 can be implemented in a computer by, for example but not limited to, executing suitable software program loaded into the computer on a digital storage media and causing the computer to execute the above steps. The method can also be implemented using suitable hardware comprising suitable image circuitry and controllers in combination with different models and memories, for example in the form of look-up tables.

In FIG. 4a a flowchart illustrating some exemplary steps performed when generating measures for $R_1$, $R_2$ and PD. First in a step 401 a first acquisition is performed. Next, in a step 403, an $R_2$ sensitizing phase is performed. Then in a step 405 a second acquisition is performed. Next, in a step 407, an $R_1$ sensitizing phase is performed. Then in a step 409 there is a waiting time. Then in a step 411 a third acquisition is performed. Then in a step 413 there is a waiting time. Finally in a step 415 the measures $R_1$, $R_2$, and PD as generated based on the three acquisitions.

In the exemplary embodiment in FIG. 4a, the order is important but the items are looped so it does not matter which item starts. From the indata for $R_1$, $R_2$ and PD, $R_2$ is calculated from the first Acquisition and the second Acquisition. $R_1$ and PD are calculated from the first acquisition and the third acquisition. In an optional step indicated in FIG. 4a, the third acquisition is repeated one or more times for a more robust calculation of $R_1$ and PD.

Below a pseudo code example is given for a sequence that can be used for the simultaneous generation of $R_1$, $R_2$ and PD measures for a number of segments:

```
For segment = 1 until numberOfSegments {
  Perform acquisition 1
  Perform R2 sensitizing phase
  Perform acquisition 2
  Perform R1 sensitizing phase
  Wait delay time
  Perform acquisition 3
  Wait delay time
  If needed then repeat acquisition 3 and delay time
}
```

Figure 4B:
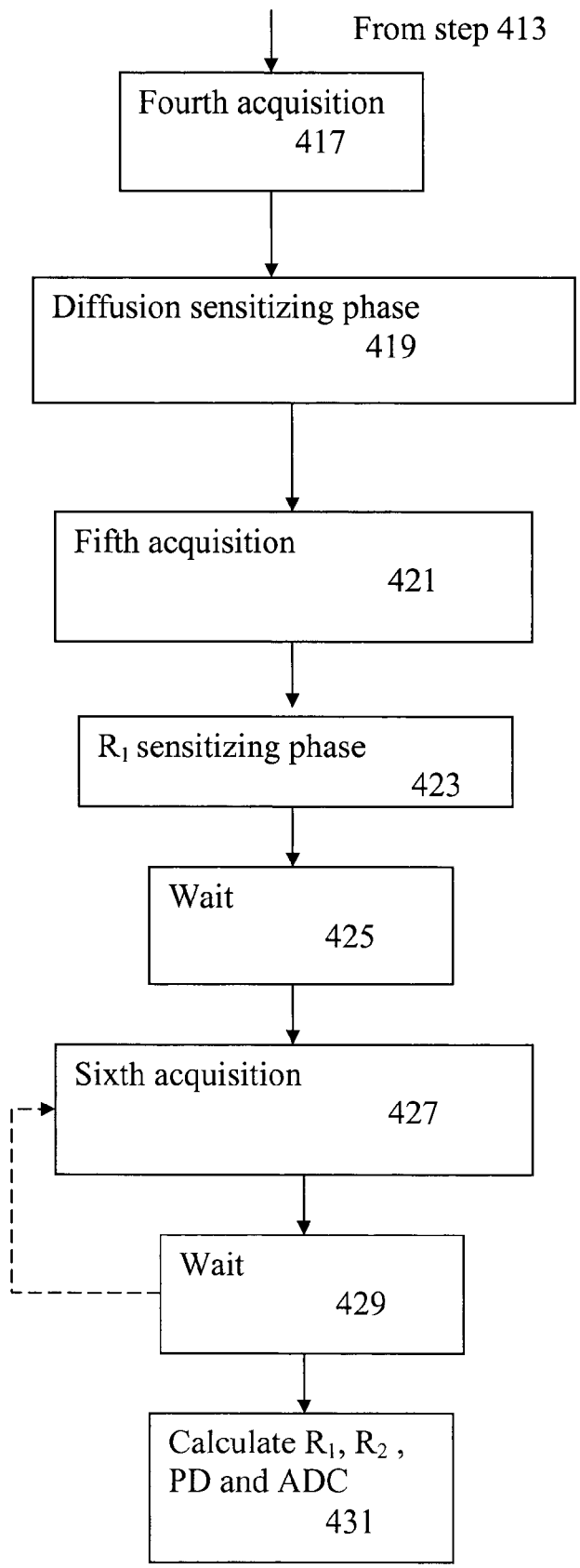

In an alternative embodiment the steps of FIG. 4a are supplemented by some additional steps to generate a combined $R_1$, $R_2$, PD and ADC measurement. Such additional steps are illustrated in FIG. 4b. First the steps of FIG. 4a are performed up to and including step 413. After step 413 the following steps shown in FIG. 4b can be performed. In a step 417 a fourth acquisition is performed. Next, in a step 419, diffusion sensitizing phase is performed. Then in a step 421 a fifth acquisition is performed. Next, in a step 423, an $R_1$ sensitizing phase is performed. Then in a step 425 there is a waiting time. Then in a step 427 a sixth acquisition is performed. Then in a step 429 there is a waiting time. Finally in a step 431 the measures $R_1$, $R_2$, PD and ADC are generated based on the six acquisitions. In accordance with some embodiments, $R_2$ is calculated from the first and second acquisition, $R_1$ and PD are calculated using the first, third, fourth and sixth acquisition. In an alternative embodiment the acquisitions three and/or six are repeated for a more robust calculation of $R_1$ and PD as is indicated in FIGS. 4a and 4b. ADC can be calculated using the first, second, fourth and fifth acquisition.

Below a pseudo code example is given for a sequence that can be used for the simultaneous generation of $R_1$, $R_2$, PD, and ADC measures for a number of segments:

```
For segment = 1 until numberOfSegments {
  Perform acquisition 1
  Perform R2 sensitizing phase
  Perform acquisition 2
  Perform R1 sensitizing phase
  Wait delay time
  Perform acquisition 3
  Wait delay time
  If needed then repeat acquisition 3 and delay time
  Perform acquisition 4
  Perform diffusion sensitizing phase
  Perform acquisition 5
  Perform R1 sensitizing phase
  Wait delay time
  Perform acquisition 6
  Wait delay time
  If needed then repeat acquisition 6 and delay time
}
```

Using the methods and devices as described herein can improve MRI scanning. In particular, physical properties of a patient can be measured on an absolute scale with a single sequence in a very short time.

The invention claimed is:

1. A magnetic resonance imaging (MRI) method of simultaneously estimating multiple physical parameters using a single gradient-echo acquisition type, comprising:
   obtaining, with an MRI system including at least a scanner and a computer, at least three parallel, segmented gradient-echo acquisitions;
   interleaving, by the MRI system, the at least three parallel, segmented gradient-echo acquisitions with an R1-sensitizing phase, an R2-sensitizing phase, and a delay time; and
   generating, by the MRI system, measures for an R1 relaxation rate, an R2 relaxation rate, and a proton density (PD) from the at least three acquisitions.

2. The method of claim 1, wherein the at least three acquisitions are performed twice, resulting in at least six acquisitions;
   the at least six acquisitions are interleaved with at least two R1-sensitizing phases, an R2-sensitizing phase, a diffusion sensitizing phase, and at least one delay time; and
   measures for R1 relaxation rate, R2 relaxation rate, PD, and apparent diffusion coefficient (ADC) are generated from the at least six acquisitions.

3. The method of claim 1, wherein the at least three acquisitions are a spoiled gradient acquisition.

4. The method of claim 1, wherein the at least three acquisitions are a balanced steady state free precession acquisition (bSSFP).

5. The method of claim 1, wherein the at least three acquisitions are an echo planar imaging acquisition (EPI).

6. The method of claim 1, wherein the at least three acquisitions are performed on a two-dimensional (2D) slice.

7. The method of claim 1, wherein the at least three acquisitions are performed on a three-dimensional (3D) volume.

8. The method of claim 1, wherein the R1-sensitizing phase comprises a 90 degrees radio frequency (RF) saturation pulse.

9. The method of claim 1, wherein the R1-sensitizing phase comprises a 180 degrees radio frequency (RF) inversion pulse.

10. The method of claim 1, wherein the R2-sensitizing phase comprises either a 90 degrees radio frequency (RF) pulse, a 180 degrees refocusing pulse, and a −90 degrees RF pulse, or a 90 degrees RF pulse, multiple 180 degrees refocusing pulses, and a −90 degrees RF pulse.

11. The method of claim 2, wherein the diffusion sensitizing phase comprises a 90 degrees radio frequency (RF) pulse, a 180 degrees refocusing pulse, and a −90 degrees RF pulse; and the 180 degrees refocusing pulse is straddled by gradients.

12. The method of claim 1, wherein the R1-relaxation rate is estimated using an image signal intensity of all acquisitions after the R1-sensitizing phase.

13. The method of claim 1, wherein the R2-relaxation rate is estimated using an image signal intensity of acquisitions before and after the R2-sensitizing phase.

14. The method of claim 1, wherein a B1 field of a scanner for obtaining the acquisitions is estimated using an image signal intensity of acquisitions before and after the R1-sensitizing phase.

15. The method of claim 2, wherein the ADC is estimated using an image signal intensity of acquisitions before and after the R2-sensitizing phase and before and after the diffusion sensitizing phase.

16. A magnetic resonance imaging device for simultaneously estimating multiple physical parameters using a single gradient-echo acquisition type, the device comprising at least a processor that is coupled to a memory and configured to:
 obtain at least three parallel, segmented gradient-echo acquisitions; and
 interleave the at least three segmented gradient-echo acquisitions with an R1-sensitizing phase, an R2-sensitizing phase, and a delay time.

17. The device of claim 16, wherein the device is further configured to generate measures for R1 relaxation rate, R2 relaxation rate, and proton density (PD) from the at least three acquisitions.

18. The device of claim 16, wherein the device is configured to perform the at least three acquisitions twice, resulting in at least six acquisitions; and to interleave the at least six acquisitions with at least two R1-sensitizing phases, an R2-sensitizing phase, a diffusion sensitizing phase, and at least one delay time.

19. The device of claim 18, wherein the device is further configured to generate measures for R1 relaxation rate, R2 relaxation rate, proton density (PD), and apparent diffusion coefficient (ADC) from the at least six acquisitions.

20. A non-transitory computer-readable medium encoded with computer-readable instructions that, when executed by a computer, cause the computer to perform a method comprising:
 obtaining at least three parallel, segmented gradient-echo acquisitions;
 interleaving the at least three segmented gradient-echo acquisitions with an R1-sensitizing phase, an R2-sensitizing phase, and a delay time; and
 generating measures for R1 relaxation rate, R2 relaxation rate, and proton density (PD) from the at least three acquisitions.

\* \* \* \* \*